United States Patent [19]

Kiser

[11] Patent Number: 5,146,161
[45] Date of Patent: Sep. 8, 1992

[54] INTEGRATED CIRCUIT TEST SYSTEM

[75] Inventor: Timothy J. Kiser, Tempe, Ariz.

[73] Assignee: VLSI Technology, Inc., San Jose, Calif.

[21] Appl. No.: 681,803

[22] Filed: Apr. 5, 1991

[51] Int. Cl.[5] .................................. G01R 31/28
[52] U.S. Cl. ............................ 324/158 R; 371/22.1
[58] Field of Search ............ 324/158 R, 73.1, 158 T; 371/22.1

[56] References Cited

U.S. PATENT DOCUMENTS

| | | | |
|---|---|---|---|
| 4,336,495 | 6/1982 | Hapke | 324/158 T |
| 4,504,783 | 3/1985 | Zasio et al. | 324/158 R |
| 5,012,185 | 4/1991 | Ohfuji | 324/158 R |
| 5,034,687 | 7/1991 | Huang et al. | 324/73.1 |

Primary Examiner—Ernest F. Karlsen
Attorney, Agent, or Firm—LaValle D. Ptak

[57] ABSTRACT

A programmable clamping circuit is operated under the control of a tester comparator/driver circuit used to test the bi-directional input/output pins of an integrated circuit. The clamping circuit is operated during the floating or tri-state mode of operation of the pin undergoing test to clamp the potential on the input/output pin to a pre-determined voltage during any floating or tri-state mode in the test signal pattern. Control of the clamping circuit is effected in synchronism with the operation of the tester comparator/driver circuit.

8 Claims, 1 Drawing Sheet

INTEGRATED CIRCUIT TEST SYSTEM

BACKGROUND

Digital test systems for checking the performance of integrated circuit devices typically are connected to the input/output pins of the integrated circuit device under test, to apply signals to and/or receive signals from the pins during a pre-established test cycle. The information which is obtained from the test circuit, through the performance of the device under test, and from the signals received from it, is employed to determine the proper functioning or malfunctioning of the device under test, as evidenced by the behavior of the device during the test cycle.

In many integrated circuit devices, CMOS technology is employed, and CMOS gates, which are connected to the bi-directional input/output pins, are capable of having one of a possible three different states or modes of operation. The pin connected to the gate may be configured to receive either a valid input high (VIH) or a valid input low (VIL) from the test system, when the pin is functioning in an input state, and a second "open-circuit" state, which is known as a "tri-state" or a "floating" state of operation. Similarly, in the third state when the pin is supplied with output signals from the gate, the output signals can be a valid output high (VOH) or valid output low (VOL).

In some test situations, when the switching times for the bi-directional input/output pins are being characterized by a test circuit, a problem has been encountered during the "tri-state" or "floating" portions of the tester cycle. For example, for some applications the bi-directional input/output pins are required to switch from a test device input state to a floating or tri-state mode, to a device output state, and finally, back to a tri-state or floating condition. When such cycling of input signals and output signals from the device under test are separated by tri-state modes of operation, the signals on the input/output pins whenever they are switched from a valid input/output level to the tri-state mode, begin to decay.

The result of the decay is capable, in at least some applications, of eventually tripping the threshold for a valid input signal, even though no such signal was supplied to the device from the tester circuit. For systems where the input/output pins are active at a level to which the signal decays, such a decay causes incorrect memory read and memory write functions during refresh cycles of memory devices included on such devices. Other incorrect operating functions also can occur, thereby invalidating the test results.

It is desirable to prevent a drift or decay of the signal level on the input/output pins of an integrated circuit device under test, during the tri-state or floating condition of operation of the integrated circuit devices connected to an input/output pin, whenever the pin of the device under test is being sequenced through an appropriate input and output test cycle.

SUMMARY OF THE INVENTION

Accordingly, it is an object of this invention to provide an improved integrated circuit device test system in which the test system can be easily isolated from the device under test.

It is another object of this invention to provide an improved integrated circuit device test system which minimizes incorrect operation of the device under test.

It is an additional object of this invention to provide an improved test circuit for characterizing and/or testing the switching times for bi-directional input/output pins of an integrated circuit device under test which clamps the voltage on the pin under test during portions of the tester cycle pattern.

It is a further object of this invention to provide an improved testing system for clamping the voltage on a bi-directional input/output pin of a circuit under test, at predetermined times during the test cycle, between the application of input signals to the pin under test and receipt of signals from the pins under test.

In a preferred embodiment of the invention, a test circuit is provided for testing the switching characteristics of bi-directional input/output pins of an integrated circuit device. The test circuit includes a first connection for applying input signals to, and receiving output signals from, a pin of the device under test. In addition, a clamping circuit, which is controlled by the test system, is connected to the pin for clamping the voltage on the pin of the device under test to a pre-determined voltage level during floating, tri-state, non-test modes of operation of the test circuit.

DETAILED DESCRIPTION

Figure 1:
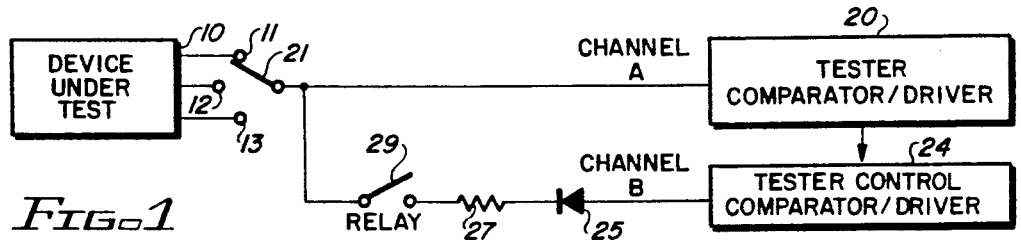
FIGS. 1 and 2 are block diagrams of preferred embodiments of the invention.

Reference now should be made to the drawing, in which the same reference numbers are used in the different figures to designate the same or similar components. Reference first should be made to FIG. 1. In this figure, an integrated circuit device 10 under test, which includes a plurality of input/output pins 11, 12, and 13, is illustrated. The pins 11, 12, and 13, of the device 10 may constitute read/write bi-directional pins for memory read and memory write functions of the circuitry in the device 10. Typically, such pins are connected to CMOS gate circuits, and are capable of either receiving input signals, or of supplying output signals, depending upon the mode or state of operation of the circuit in the device 10, which is undergoing the test.

A tester comparator/driver circuit 20 is provided for supplying test signals to, and receiving output signals from, a selected one of the device pins 11, 12, and 13 for characterizing the switching times of the device 10, and for determining whether the device meets the operating parameters which have been established for the device.

To accomplish the desired testing, a connection is made to an appropriate one of the input/output pins 11, 12, or 13 for operation of a pre-established test cycle. As illustrated in FIG. 1, the connection is shown as a switch terminal 21 connected to the device pin 11. A typical application is for the tester driver 20 to supply an input to the pin of the device under test. This then is terminated, and the pin under test is allowed to go to a tri-state or floating condition. Then the tester comparator/driver 20 switches to a receive mode of operation where it responds to an output signal supplied from device pin 11, through the terminal 21, to compare this output with a pre-established output level in the tester 20. Output levels which are either valid output low (VOL) or valid output high (VOH) are compared in suitable conventional comparator circuitry included within the tester 20. Once this operation has been completed, the pin 11 typically is switched back to a tri-state or floating state of operation.

The circuitry within the tester comparator/driver 20, which has been described thus far, and the operating sequence, is standard and well known. Such tests are employed throughout the electronics industry to check the proper functional operation of integrated circuit devices at the factory, as well as when devices, such as the device 10, are installed into networks or an operating system. The tests are used to verify that proper operation of the device 10 takes place when it is used in an operating environment.

A problem occurs, however, when the input/output pin of a typical CMOS device under test, such as the pin 11, is switched from a valid input/output level to a tri-state or floating level. The level of the signal for a device pin having active valid input low/active valid output low (VIL/VOL), is shown in waveform E of FIG. 3. During the floating or tri-state time ("T") of operation, the signal on the pin begins to decay. It has been found that in some situations, as illustrated in waveform E of FIG. 3, this decay reaches a low enough level that the threshold for a valid input low level is reached. The circuit then is "tripped", providing an incorrect output signal. If these pins are "active low", as in this example, such a level decay causes incorrect memory read and memory write functions in the device 10 during refresh cycle. Even if this did not occur, the signal transition is noisy if the decay occurs near the point of a valid output low (VOL) signal in the test cycle providing erroneous data relative to the timing of such a signal, as ascertained by the circuitry within the tester comparator/driver circuit 20.

To overcome the problem of decaying signals during the tri-state or floating mode of operation of the tester comparator/driver circuit 20, a second channel, Channel B shown in FIG. 1, operated by a similar tester driver/comparator control circuit 24, has been added to the otherwise conventional test circuit shown in FIG. 1. The tester control circuit 24 is operated in synchronism with the signals supplied to and received from the tester comparator/driver circuit 20 by means of a tester input clock (waveform C of FIG. 3) used to represent a time base for each test pattern cycle.

Figure 3:
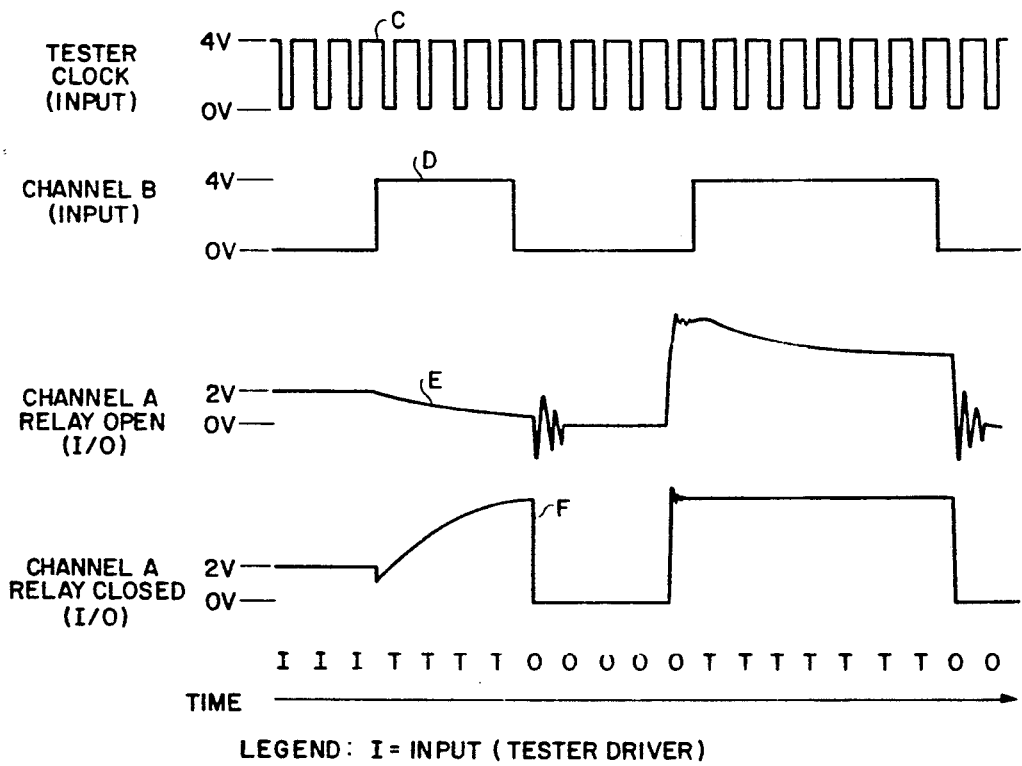
FIG. 3 is a timing diagram of signals occurring in the operation of the device of FIG. 1, useful in describing the nature of such operation.

The tester control circuit 24 supplies clamping voltage signals through a high speed blocking diode 25, a pull-up resistor 27, and a relay 29 (when it is closed) to the terminal 21. Waveform D of FIG. 3 shows the signals supplied from the tester control circuit 24 over channel B to the switch terminal 21 during the operation of the tester comparator/driver 20 for a typical test cycle. Waveform F of FIG. 3 shows the signal appearing on the terminal 21 during the operation of the tester comparator/driver 20 and the tester control circuit 24, when the relay switch 29 is closed. The same test cycle is illustrated in waveform E for channel A with the relay 29 open, or channel B not functioning. Consequently, when there is no output from the tester control 24, or it is held to a zero volt or ground level, the signals appearing on channel A, whether these signals are input signals ("I") supplied from the tester, or are output signals ("O") from the device under test, appear in both waveforms E and F during the time periods marked "I" and "O", respectively, in FIG. 3.

The signal decay which has been described above, in conjunction with the operation of the standard tester comparator/driver circuit 20 operation, during the tri-state or floating times of operation in the cycle, is shown in waveform E. In waveform F, however, the results of the application of the voltage clamping signals, illustrated in waveform D, are readily apparent. No decay whatsoever takes place between the termination of the input signal "I" from the tester 20, and the output signal "O" from the device under test during the first tri-state "T" period of operation. Instead, the clamping circuit signals applied over channel B, from the tester control circuit 24, drive the voltage on channel A (the switch or probe 21) to a relatively high (4 Volt) level at a rate determined by the RC time constants of the circuit.

As soon as the clamping voltage, however, is terminated by the tester control circuit 24, this voltage immediately drops, and is at whatever voltage otherwise appears on channel A as a result of signals shared between the tester comparator/driver circuit 20 and the device undergoing test 10, depending upon whether these are input or output signals.

Two important functions are performed by the addition of the tester control circuit 24 and channel B, as described above in conjunction with FIG. 1. The first function allows the test engineer the flexibility to clamp or pull-up the voltage on the bi-directional pin under test (11, as shown in FIG. 1) whenever the pin is tri-stated or floating during any tester cycle in the pattern of operation of the tester comparator/driver circuit 20. When the operation of the tester control circuit 24 is synchronized with the timing of the operation of the tester comparator/driver 20, the application of the clamping voltage is fully programmable in accordance with the programmed test cycle of the tester 20.

The second important function, which is performed by the addition of the tester control 24 and the clamping channel B, including the diode 25 and resistor 27, is a voltage clamp for the switching transitions of the tester input drivers or the device outputs. The manner in which the switching transitions are clamped and made more precise, is apparent from a comparison of the falling edges of the waveform of Figure F with the corresponding transitions shown in waveform E of FIG. 3. When the switching transitions are clamped in this manner, a more precise operation of the tester comparator/driver circuit 20 occurs, and more accurate test information is obtained.

Figure 2:
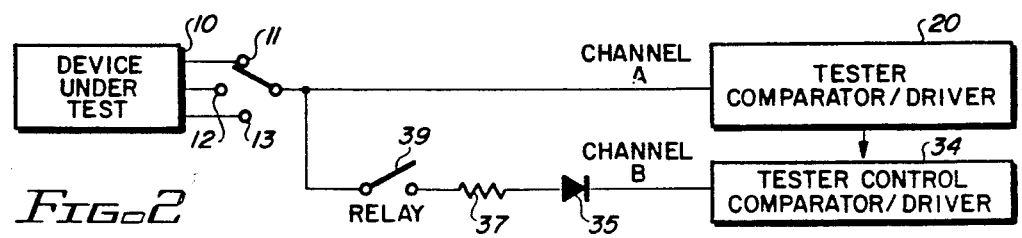

FIG. 2 illustrates a modification of the circuit of FIG. 1, which is identical to the circuit of FIG. 1 except the clamping circuit clamps the voltage on the probe 21 to a low or negative potential, instead of a high or positive potential, as occurs with the circuit of FIG. 1. The circuit of FIG. 2 is used when the device pin has active input high/active output high (VIH/VOH) levels. Clamping is accomplished by a tester control circuit 34, which supplies a negative clamping potential through a blocking diode 35 (reversed in polarity from the diode 25 shown in FIG. 1), a pull down resistor 37, and a relay 39, which is comparable to the relay 29 of FIG. 1. In all other respects, the circuit of FIG. 2 operates in a manner identical to the circuit of FIG. 1, except that the clamping potential is pulled to a low or ground potential, instead of the positive potential which is obtained from the circuit of FIG. 1.

The circuits of FIGS. 1 and 2 also could be combined together with a single tester comparator/driver circuit 20. Closure of one of the relays 29 and 39 then would determine the "pull-up" or "pull-down" clamping potential required for the particular test circuit operation. In fact, with suitable programming accomplished in a conventional manner, the clamping potential (high or low) can be varied within a single test pattern cycle, if such operation should ever be required. The underlying principles of operation are the same, whether the circuit of FIG. 1 or of FIG. 2 is used.

The foregoing description of the preferred embodiments of the invention is to be considered as illustrative of the invention, and not as limiting. Various changes and modifications will occur to those skilled in the art without departing from the true scope of the invention as defined in the appended claims.

I claim:

1. A system for testing the switching characteristics of bi-directional input/output pins of an integrated circuit device including in combination:

test circuit means operating in a drive mode in which said test circuit means applies signals to the input/output pin of a circuit device undergoing test, and operating in a comparing mode for receiving signals from the input/output pin of the device undergoing test, said test circuit means switching to a floating mode of operation between the drive mode and comparing mode of operation;

first connecting means for connecting said test circuit means to an input/output pin of a circuit to be tested; and clamping circuit means controlled by said test circuit means and connected with said first connecting means for clamping the input/output pin of a circuit undergoing test to a pre-determined voltage level during the floating mode of operation of said test circuit means, said clamping circuit means being turned off by said test circuit means during either said drive mode or said comparing mode of operation of said test circuit means, and said clamping circuit means being rendered operative to supply a pre-determined clamping voltage to the input/output pin of a circuit undergoing test when said test circuit means is in its floating mode of operation.

2. The combination according to claim 1 wherein said test circuit means synchronizes the operation of said clamping circuit means in accordance with the mode of operation of said test circuit means.

3. The combination according to claim 2 wherein said clamping circuit means includes blocking means for permitting the passage signals of one polarity from said clamping means to said first connecting means, and for blocking signals of an opposite polarity from being passed from said first connecting means to said clamping means.

4. The combination according to claim 3 further including second connecting means for selectively electrically connecting said clamping circuit means with said first connecting means.

5. The combination according to claim 4 wherein said second connection means comprises a relay switch.

6. The combination according to claim 1 wherein said clamping circuit means includes blocking means for permitting the passage signals of one polarity from said clamping means to said first connecting means, and for blocking signals of an opposite polarity from being passed from said first connecting means to said clamping means.

7. The combination according to claim 1 further including second connecting means for selectively electrically connecting said clamping circuit means with said first connecting means.

8. The combination according to claim 7 wherein said second connection means comprises a relay switch.

* * * * *